(12) United States Patent
Kunz (10) Patent No.: US 9,856,629 B1
(45) Date of Patent: Jan. 2, 2018

(54) LIP SHROUD FOR CAST LIP ON A WORK IMPLEMENT

(71) Applicant: Caterpillar Inc., Peoria, IL (US)

(72) Inventor: Phillip John Kunz, Morton, IL (US)

(73) Assignee: Caterpillar Inc., Peoria, IL (US)

( * ) Notice: Subject to any disclaimer, the term of this patent is extended or adjusted under 35 U.S.C. 154(b) by 0 days.

(21) Appl. No.: 15/215,622

(22) Filed: Jul. 21, 2016

(51) Int. Cl.
  *E02F 9/28* (2006.01)
  *E02F 3/60* (2006.01)
  *G06F 17/50* (2006.01)

(52) U.S. Cl.
  CPC .............. *E02F 9/2883* (2013.01); *E02F 3/60* (2013.01); *G06F 17/50* (2013.01)

(58) Field of Classification Search
  CPC ..... E02F 9/2825; E02F 9/2833; E02F 9/2841; E02F 9/2816; E02F 9/2883; E02F 3/40; E02F 3/60; G06F 17/50
  USPC ........ 37/446, 451–455; 172/719, 772, 772.5, 172/701.1–701.3
  See application file for complete search history.

(56) References Cited

U.S. PATENT DOCUMENTS

| 4,047,312 | A | * | 9/1977 | Stepe | E02F 9/2816 172/701.2 |
| 6,145,224 | A | * | 11/2000 | Stickling | E02F 9/2825 37/456 |
| 6,240,663 | B1 | * | 6/2001 | Robinson | E02F 9/2825 37/455 |
| 8,959,807 | B2 | * | 2/2015 | LaHood | E02F 3/8152 37/455 |
| 9,359,745 | B2 | * | 6/2016 | Serrurier | E02F 9/2883 |
| 2004/0098886 | A1 | * | 5/2004 | Hohmann | E02F 9/2825 37/451 |
| 2007/0204490 | A1 | * | 9/2007 | Jones | E02F 9/28 37/452 |
| 2013/0180137 | A1 | | 7/2013 | Hurley et al. | |

FOREIGN PATENT DOCUMENTS

AU    2012268793    7/2013

OTHER PUBLICATIONS

Bradken, Penetrator Product Overview, product brochure, Bradken® 2013.

* cited by examiner

*Primary Examiner* — Robert Pezzuto
(74) *Attorney, Agent, or Firm* — Finnegan, Henderson, Farabow, Garrett & Dunner, LLP (57) ABSTRACT

A lip shroud may include a front, wedge-shaped portion, an intermediate transition portion, and a rear mounting portion opposite the front, wedge-shaped portion. The intermediate transition portion of the lip shroud may be configured with at least one upwardly and rearwardly inclined transition surface that merges into a front edge of the rear mounting portion. The at least one upwardly and rearwardly inclined transition surface may include two opposite side, upwardly inclined surfaces that extend between rearward side edges of the at least one transition surface and substantially an entire length of each of opposite side edges of the rear mounting portion. The two opposite side, upwardly inclined surfaces may include outer side edges configured to form a smooth, upwardly sloped and outwardly convex-shaped profile merging into the opposite side edges of the rear mounting portion.

25 Claims, 5 Drawing Sheets

LIP SHROUD FOR CAST LIP ON A WORK IMPLEMENT

TECHNICAL FIELD

The present disclosure relates generally to a lip shroud and, more particularly, to a lip shroud for a cast lip on a work implement.

BACKGROUND

Earth-working machines, such as, for example, draglines, may be used for digging or ripping into the earth or rock and/or moving loosened material from one place to another. These machines may include a bucket for excavating or moving the material. The bucket can be subjected to extreme wear from abrasion and impacts experienced during the earth-working applications.

The bucket may include a lip including a plurality of noses projecting from a front edge of the lip. The lip may also include wing plates located at opposite sides of the lip. Various wear components may be coupled to the lip to protect the front edge of the lip. For example, teeth may be mountable to the noses, lip shrouds may be mountable between the noses, and wing shrouds may be mountable to the wing plates. The wear components may be releasably secured to the lip by retention systems, such as retaining members or locking pin systems.

An example of a retention system for retaining a wear member on an adapter fixed to a front edge of a bucket is described in U.S. Pat. No. 8,434,248 (the '248 patent) issued to Woerman et al. Specifically, the '248 patent discloses a retention assembly including a bolt that passes through openings in the wear member, a passage in the adapter, and a fastening receptacle for securing the wear member to the adapter.

While the system of the '248 patent may retain the wear member on the adapter, it may still be less than optimal. For example, the lip shroud may include adjoining surfaces near a mounting portion of the shroud that intersect at angles or include concave fillets therebetween, which may induce excessive stresses in the shroud and shorten the life of the shroud. The overall configuration of the lip shroud may also benefit from transitions between adjoining surfaces that increase the amount of material subject to wear, and thereby increase the life of the shroud.

The disclosed lip shroud is directed to overcoming one or more of the problems set forth above.

SUMMARY

In one aspect, the present disclosure is directed to a lip shroud. The lip shroud may include a front, wedge-shaped portion, an intermediate transition portion, and a rear mounting portion opposite the front, wedge-shaped portion. The intermediate transition portion of the lip shroud may be configured with at least one upwardly and rearwardly inclined transition surface that merges into a front edge of the rear mounting portion. The at least one upwardly and rearwardly inclined transition surface may further include two opposite side, upwardly inclined surfaces that extend between rearward side edges of the at least one transition surface and substantially an entire length of each of opposite side edges of the rear mounting portion. The two opposite side, upwardly inclined surfaces may include outer side edges configured to form a smooth, upwardly sloped and outwardly convex-shaped profile merging into the opposite side edges of the rear mounting portion.

In another aspect, the present disclosure is directed to a wear assembly for an earth-working tool. The wear assembly may include a lip, at least two teeth connected to a front edge of the lip, and at least one lip shroud connected to the front edge of the lip in between the at least two teeth. The lip shroud may include a front, wedge-shaped portion, an intermediate transition portion, and a rear mounting portion opposite the front, wedge-shaped portion. The intermediate transition portion of the lip shroud may be configured with at least one upwardly and rearwardly inclined transition surface that merges into a front edge of the rear mounting portion. The at least one upwardly and rearwardly inclined transition surface may further include two opposite side, upwardly inclined surfaces that extend between rearward side edges of the at least one transition surface and substantially an entire length of each of opposite side edges of the rear mounting portion. The two opposite side, upwardly inclined surfaces may include outer side edges configured to form a smooth, upwardly sloped and outwardly convex-shaped profile merging into the opposite side edges of the rear mounting portion.

In yet another aspect, the present disclosure is directed to a lip shroud including a front, wedge-shaped portion, an intermediate transition portion, and a rear mounting portion opposite the front, wedge-shaped portion. The intermediate transition portion of the lip shroud may be configured with a first upwardly and rearwardly inclined transition surface that forms a first angle with a horizontal plane, and a second upwardly and rearwardly inclined transition surface that forms a second angle different from the first angle with the horizontal plane. The second upwardly and rearwardly inclined transition surface may merge into a front edge of the rear mounting portion, and may further include two opposite side, upwardly inclined surfaces that extend between rearward side edges of the second transition surface and substantially an entire length of each of opposite side edges of the rear mounting portion. The two opposite side, upwardly inclined surfaces may include outer side edges configured to form a smooth, upwardly sloped and outwardly convex-shaped profile merging into the opposite side edges of the rear mounting portion. The first transition surface may include opposite side wing portions that extend substantially vertically upward from each of opposite sides of the first transition surface, wherein each of the opposite side wing portions terminates in an upper edge that is substantially horizontal. The upper edge of each of the opposite side wing portions may merge smoothly into a contiguous one of the outer side edges of the two opposite side, upwardly inclined surfaces, and the upper edge of each of the opposite side wing portions and the contiguous one of the outer side edges of the two opposite side, upwardly inclined surfaces together may form an outwardly convex-shaped profile as viewed in a vertical direction, wherein the outwardly convex-shaped profile merges into each of the opposite side edges of the rear mounting portion at a rear edge of the rear mounting portion.

DETAILED DESCRIPTION

Reference will now be made in detail to exemplary embodiments, which are illustrated in the accompanying drawings. Wherever possible, the same reference numbers will be used throughout the drawings to refer to the same or like parts.

Figure 1:
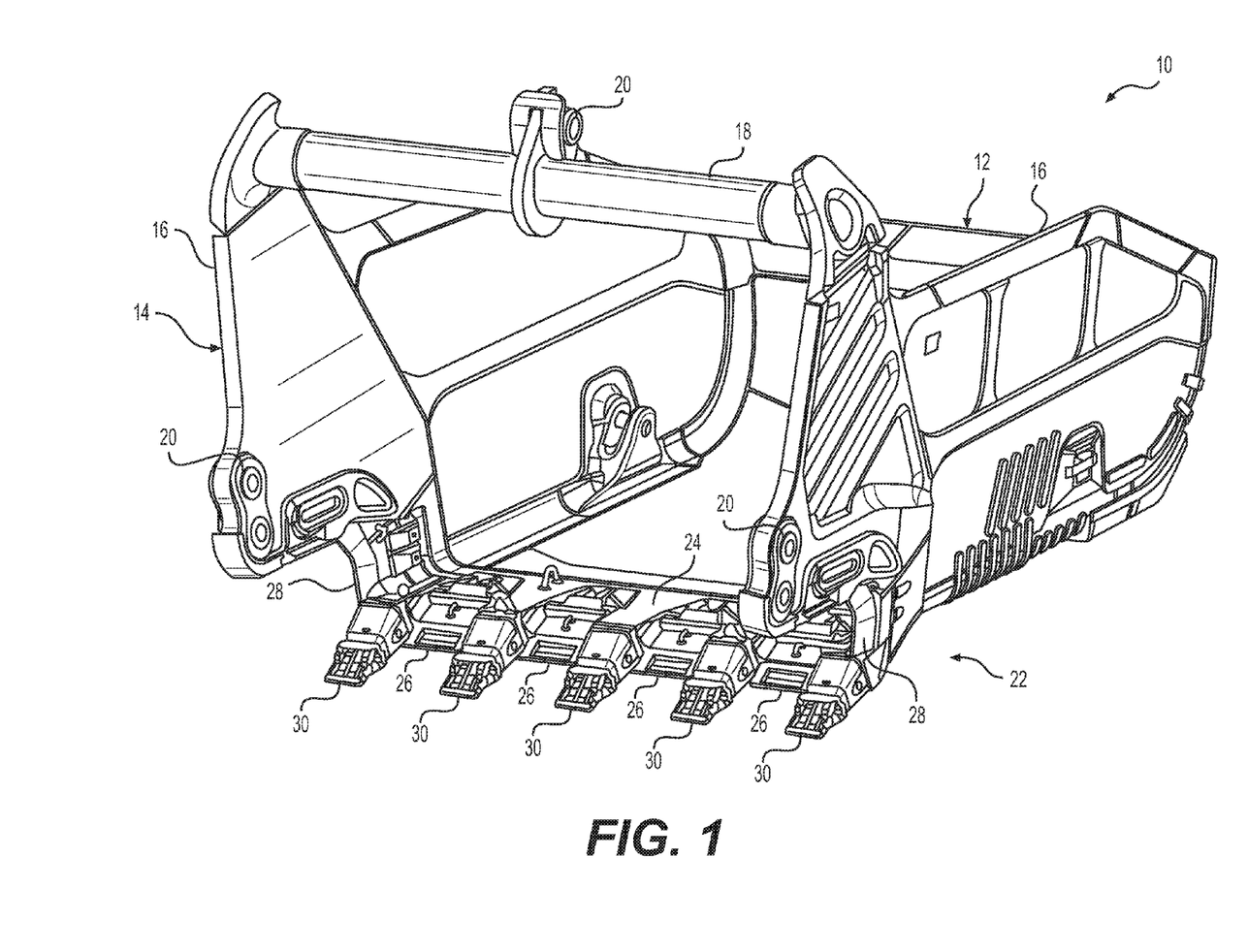
FIG. 1 is a perspective view of a bucket including a lip, lip shrouds, wing shrouds, and retention systems, according to an exemplary embodiment.

An exemplary embodiment of a work implement, e.g., a machine bucket 10, is illustrated in FIG. 1. In the exemplary embodiment, the bucket 10 may be attached to a dragline (not shown) that is configured to remove material, such as earthen material, with the bucket 10. The dragline may manipulate the bucket 10 by utilizing a hoist mechanism (not shown) and a drag mechanism (not shown) that are controlled by an operator in a machine cabin (not shown) of the dragline. Alternatively, the bucket 10 may be attached to other types of machines known in the art, such as excavators or other earth-working machines. As another alternative, the work implement may embody any device used to perform a task assigned to a machine.

The bucket 10 may include a main body 12, which may be a box-like structure with an open top, and an open front end 14 through which the material may pass to enter the main body 12. The main body 12 may include side walls 16 that are connected by a cross beam 18. The bucket 10 may include one or more connecting mechanisms 20, e.g., one or more brackets, for connecting to chains or cables used for manipulating the bucket 10. For example, the cross beam 18 may include one or more of the connecting mechanisms 20 for connecting to one or more chains associated with the hoist mechanism, and the side walls 16 may include one or more of the connecting mechanisms 20 for connecting to one or more chains for the drag mechanism.

The bucket 10 may include a wear assembly 22 attached to the main body 12 of the bucket 10, e.g., by welding, and the wear assembly may be replaceable. The wear assembly 22 may include a lip 24 and one or more ground engaging tools (GET) attached to the lip 24, such as one or more lip shrouds 26, one or more wing shrouds 28, and/or a plurality of teeth 30.

Figures 2, 3:
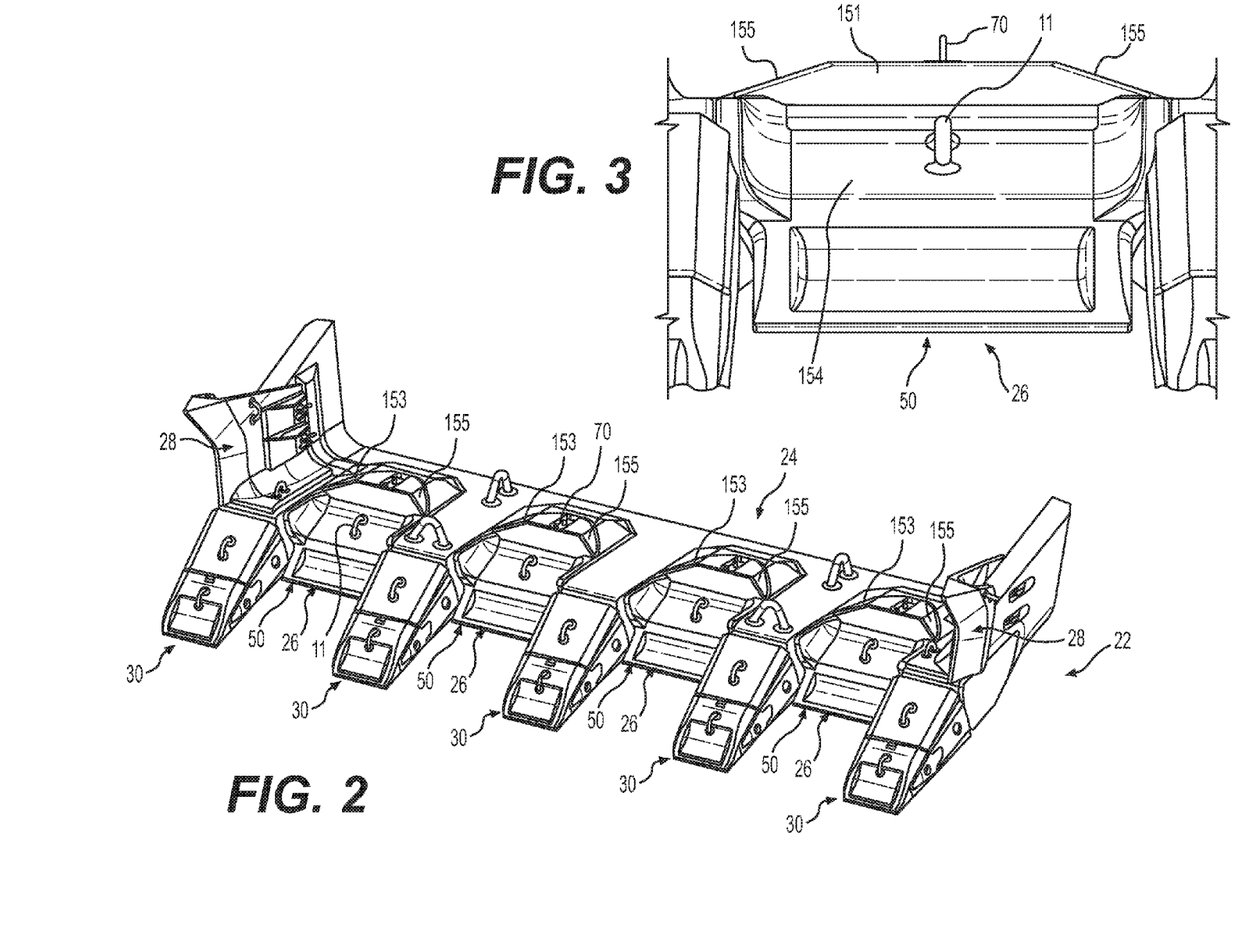
FIG. 2 is a perspective view of the lip, lip shrouds, wing shrouds, and retention systems of FIG. 1.
FIG. 3 is a front elevation view of a lip shroud mounted on a lip in between two teeth.
Figure 4:
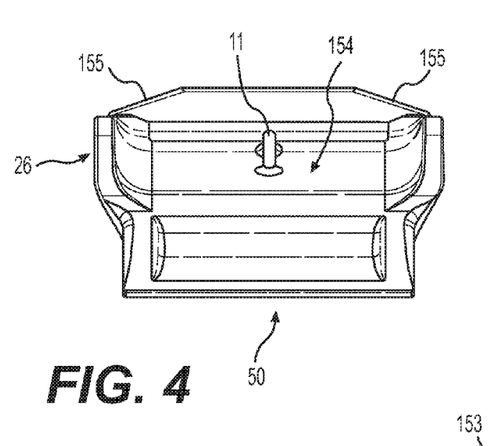
FIG. 4 is a front elevation view of the lip shroud of FIG. 3.

FIG. 2 is an enlarged perspective view of the wear assembly 22, according to an exemplary embodiment. The lip 24 may also include one or more noses that project forwardly from a front edge of the lip 24, and the teeth 30 may attach directly or indirectly (e.g., via adapters or couplers) to the noses. In an embodiment, the teeth 30 may be two-piece components including a tip that may be connected to an adapter, e.g., by welding, a coupler, or other retaining system. The adapters may be removably connected to the respective noses via a locking pin or other retention system. Alternatively, the GET (e.g., the lip shrouds 26, the wing shrouds 28, and/or the teeth 30) may take any form known in the art, such as, for example, a single-piece component or multi-piece component that is removably connected to the noses, such as a fork or other multi-point configuration, a chisel or blade configuration, a blunt-end configuration, or other single-point configuration.

The terms "front" and "rear" are used herein to refer to the relative positions of the components of the exemplary wear assembly 22. When used herein, "front" refers to one side of the wear assembly 22, e.g., closer to the tips of the noses of the lip 24 and/or the teeth 30 attached to the noses. In contrast, "rear" refers to the side of the wear assembly 22 that is opposite the front side. The rear side of the wear assembly 22 may be the side that is connected to the main body 12 of the bucket 10 when the wear assembly 22 is attached to the main body 12. The terms "upper", "upward", "upwardly inclined", "lower", "downward", "downwardly inclined", horizontal, and vertical are used herein to refer to relative orientations and locations of various surfaces on lip shroud 26 and lip 24 of wear assembly 22 when the bucket 10 is sitting level on the ground.

Lip shrouds 26 and wing shrouds 28 may protect the front edge of the lip 24. Lip shrouds 26 may be mountable on lip 24 between the noses, and wing shrouds 28 may be mountable on wing plate portions of the lip 24 that extend upward (e.g., vertically or at an angle that is generally upward) relative to a central plate portion. As shown in FIGS. 1 and 2, the wear assembly 22 may include five teeth 30 that are spaced apart along the length of the lip 24, four lip shrouds 26 that are located between adjacent teeth 30, and two wing shrouds 28. Each of the teeth 30, the lip shrouds 26, and the wing shrouds 28 may be replaceable and designed to protect a different portion of the lip 24 from abrasive wear. Alternatively, other numbers of the teeth 30, the lip shrouds 26, and the wing shrouds 28 may be provided, depending on the application.

Figure 7:
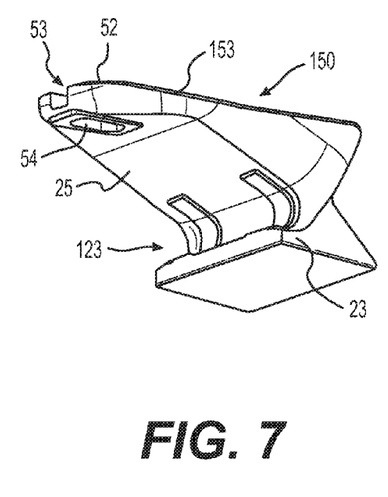
FIG. 7 is another perspective view of the lip shroud of FIG. 3.

Each of the lip shrouds 26 and the wing shrouds 28 may include a front edge, wedge-shaped portion 50 that hooks over the front edge of the lip 24. The front edge, wedge-shaped portion 50 of each lip shroud 26 may be formed by a wedge-shaped intersection between a lower leg 23 and an upper leg 25, with a groove 123 defined between the lower and upper legs on the rear side of the wedge-shaped intersection, as clearly shown in FIGS. 7 and 10. Each of the lip shrouds 26 may also include a rear mounting portion 52 configured to receive a retention system for clamping or attaching the respective lip shroud 26, or other GET in a removable manner to the lip 24 or other portion of a work implement.

FIG. 3 shows a front elevation view of a lip shroud 26 in between two adjacent teeth 30 mounted on a front edge of lip 24. Lip shroud 26 may include a lifting hook 11 located approximately in a center portion of an upwardly and rearwardly inclined, lower transition surface 154. Lower transition surface 154 may merge into an upwardly and rearwardly inclined, upper transition surface 151 that in turn merges with the substantially horizontal rear mounting portion 52 of lip shroud 26. In various exemplary embodiments the lower transition surface 154 may be oriented at a different angle or substantially the same angle relative to a horizontal plane as the upper transition surface 151. A wedge-type retention system or other locking member may include an access member 70 configured to extend upwardly through an aperture 54 formed in the rear mounting portion 52 (best seen in the top plan view of FIG. 8 and the bottom plan view of FIG. 9). The retention system facilitates attachment of lip shrouds 26 to the lip 24.

Figure 6:
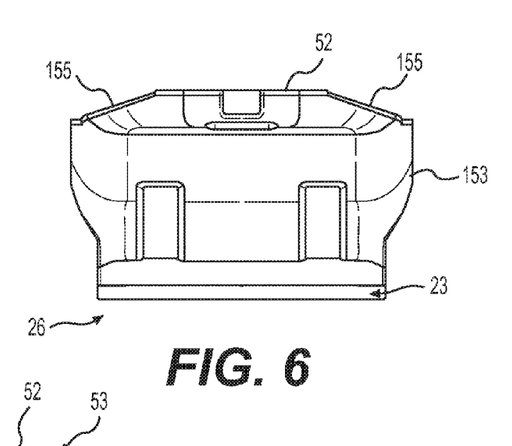
FIG. 6 is a rear elevation view of the lip shroud of FIG. 3.
Figure 10:
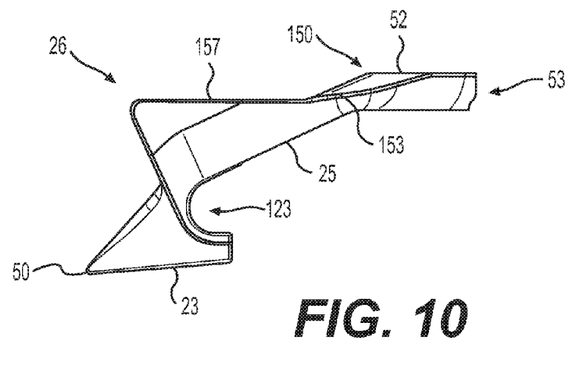
FIG. 10 is a side elevation view of the lip shroud of FIG. 3.

In various alternative embodiments, the rear mounting portion 52 of lip shroud 26 may include one or more apertures 54 and a bottom surface that may be generally flat, as best seen in the rear elevation view of FIG. 6 and the side elevation view of FIG. 10. The aperture 54 may receive the retention system, with access member 70 of the retention system protruding above the top surface of rear mounting portion 52, thereby enabling manipulation of the retention system for installation and removal of lip shroud 26 to and from lip 24. The retention systems and access member 70 may be configured to clamp or otherwise attach lip shroud 26 and wing shrouds 28 in a removable manner to lip 24.

Lip shroud 26 may include a front, wedge-shaped portion formed by the intersection of lower leg 23 and upper leg 25, an intermediate transition portion, and the rear mounting portion 52 opposite the front, wedge-shaped portion. The intermediate transition portion of lip shroud 26 may be configured with at least one upwardly and rearwardly inclined transition surface 154, 151 that merges into a front edge of the rear mounting portion 52. The at least one upwardly and rearwardly inclined transition surface may further include two opposite side, upwardly inclined surfaces 155, best seen in the perspective view of FIG. 5 and the top plan view of FIG. 8. The two opposite side, upwardly inclined surfaces 155 may extend between rearward side edges of the at least one transition surface 154, 151 and substantially an entire length of each of opposite side edges of the rear mounting portion 52.

Figure 5:
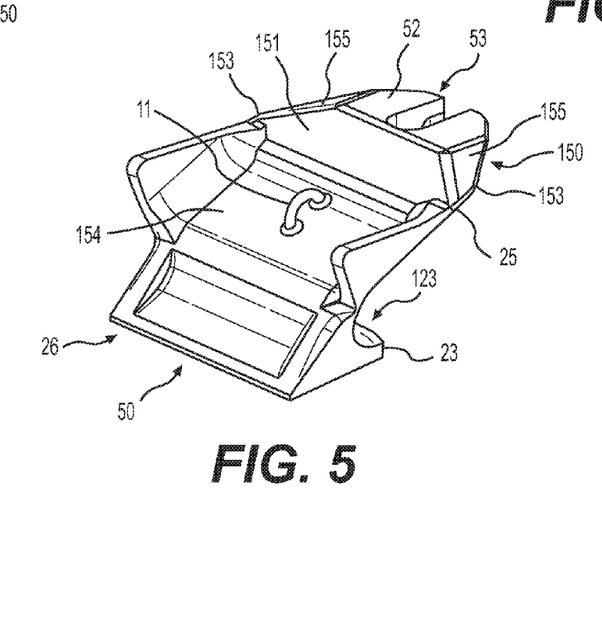
FIG. 5 is a perspective view of the lip shroud of FIG. 3.
Figure 8:
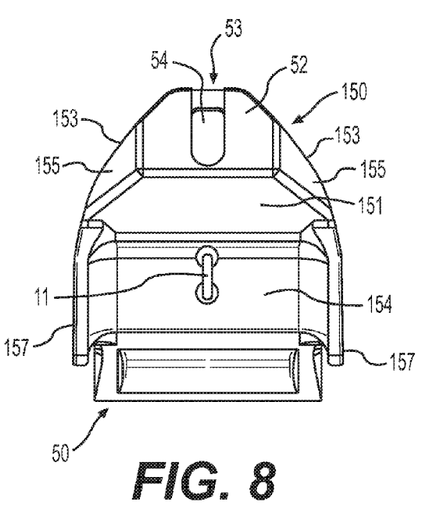
FIG. 8 is a top plan view of the lip shroud of FIG. 3.
Figure 9:
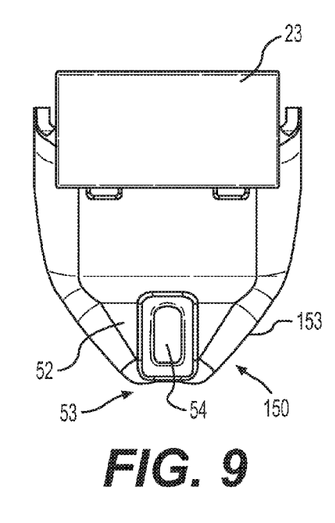
FIG. 9 is a bottom plan view of the lip shroud of FIG. 3.

As best seen in the perspective view of FIG. 5, the top plan view of FIG. 8, the bottom plan view of FIG. 9, and the side elevation view of FIG. 10, the two opposite side, upwardly inclined surfaces 155 may include outer side edges 153 configured to form a smooth, upwardly sloped and outwardly convex-shaped profile 150 merging into the opposite side edges of the rear mounting portion 52. The smooth, outwardly convex-shaped profile 150 at the transition between the upwardly inclined surfaces 155 and the rear mounting portion 52 may significantly reduce stresses that may otherwise be present in the region of the rear mounting portion if the transition to the rear mounting portion includes relatively sharp angles or concave intersections forming fillets between adjacent surfaces. The terms "smooth" and "smoothly" as used herein refer to surfaces that are free from unevenness or sudden changes in profile that may result in areas where structural stresses could be concentrated.

In the exemplary embodiment of lip shroud 26 shown in the figures, the at least one upwardly and rearwardly inclined transition surface of the intermediate transition portion of lip shroud 26 may include a lower transition surface 154 and an upper transition surface 151, as best seen in the perspective view of FIG. 5 and the top plan view of FIG. 8. A first angle formed between the lower transition surface 154 and a horizontal plane may be different from a second angle formed between the upper transition surface and the horizontal plane.

The lower transition surface 154 of lip shroud 26 may include a lifting hook 11 protruding therefrom for lifting of the lip shroud. As shown in FIG. 2, the lifting hooks 11 may assist with installation and removal of lip shrouds 26 in between pairs of teeth 30 all attached along a front edge of lip 24.

The upper transition surface 151 may include the two opposite side, upwardly inclined surfaces 155 that extend between each of rearward side edges of the upper transition surface and substantially an entire length of each of opposite side edges of the rear mounting portion 52. The upper transition surface 151 may also include a central portion that merges into the front edge of the rear mounting portion 52. Each of the two opposite side, upwardly inclined surfaces 155 may intersect with the central portion of upper transition surface 151 at an obtuse angle along each of rearward side edges of the upper transition surface. In various embodiments according to this disclosure, the surfaces 155 may be formed together with the rest of lip shroud 26 in one unitary, cast part, via 3D manufacturing processes, or joined along the rearward side edges of the upper transition surface using known processes that may include brazing, welding, etc. As shown in FIGS. 5 and 8, the surfaces 155 may extend between each of the rearward side edges of the upper transition surface 151 and substantially an entire length of each of opposite side edges of the rear mounting portion 52.

As further shown in FIG. 5 and FIG. 8, the lower transition surface 154 may include opposite side wing portions 157 that extend substantially vertically upward from each of opposite sides of the lower transition surface. Each of the opposite side wing portions 157 may terminate in an upper edge that is substantially horizontal, as best seen in the side elevation view of FIG. 10. The upper edge of each of the opposite side wing portions 157 may be configured to merge smoothly into a contiguous one of the outer side edges of the two opposite side, upwardly inclined surfaces 155. As best seen in the perspective view of FIG. 5, the top plan view of FIG. 8, and the side elevation view of FIG. 10, the upper edge of each of the opposite side wing portions 157 and the contiguous one of the outer side edges of the two opposite side, upwardly inclined surfaces 155 together may form an outwardly convex-shaped profile 150 as viewed in a vertical direction. The outwardly convex-shaped profile 150 merges into each of the opposite side edges of the rear mounting portion 52 at a rear edge 53 of the rear mounting portion 52. As a result of the above-discussed configuration, stresses that may otherwise be present in the transitional regions between the rear mounting portion 52 and the intermediate transition portion of lip shroud 26 may be significantly reduced. Moreover, the opposite side, upwardly inclined surfaces 155 add additional material along regions of the lip shroud 26 that may be subjected to wear as material passes over the lip 24. The reduced stresses and increased wear material may significantly increase the life of each lip shroud 26, and reduce costs associated with more frequent replacement of lip shrouds lacking the above-described features.

INDUSTRIAL APPLICABILITY

The disclosed features for a lip shroud and wear assembly including the lip shroud may significantly increase the life of the shroud and reduce costs associated with replacing the shroud and the lip on which the shroud is installed. The configurations of various embodiments of a lip shroud according to this disclosure may eliminate high stress areas previously associated with transitional regions between the rear mounting portion of the lip shroud and remaining portions of the shroud.

A wear assembly 22 for an earth-working tool 10 according to various exemplary embodiments of this disclosure may include a lip 24 configured to be attached along a front edge of an earth-working implement, at least two teeth 30 connected to a front edge of the lip 24, and at least one lip shroud 26 connected to the front edge of the lip in between the at least two teeth 30. As discussed above, the lip shroud 26 may include a front, wedge-shaped portion, an intermediate transition portion, and a rear mounting portion opposite the front, wedge-shaped portion. The intermediate transition portion of the lip shroud may be configured with at face that merges into a front edge of the rear mounting portion 52. The intermediate transition portion of the lip shroud may be configured to guide earthen materials over the front edge of the lip 24 in between the teeth 30 and protect the surfaces of the lip in between the teeth from wear. The at least one upwardly and rearwardly inclined transition surface may further include two opposite side, upwardly inclined surfaces 155 that extend between rearward side edges of the at least one transition surface and substantially an entire length of each of opposite side edges of the rear mounting portion. The two opposite side, upwardly inclined surfaces 155 may include outer side edges 153 configured to form a smooth, upwardly sloped and outwardly convex-shaped profile 150 merging into the opposite side edges of the rear mounting portion 52.

The at least one upwardly and rearwardly inclined transition surface of the intermediate transition portion of the lip shroud 26 may include the lower transition surface 154 and the upper transition surface 151, wherein a first angle formed between the lower transition surface 154 and a horizontal plane is different from a second angle formed between the upper transition surface 151 and the horizontal plane. In some alternative embodiments, the number of transition surfaces that make up the intermediate transition portion of the lip shroud may be increased or decreased, and two or more of the transition surfaces may lie along the same plane or substantially the same plane. The upper transition surface 151 of the lip shroud 26 may include a central portion that merges into the front edge of the rear mounting portion 52, and each of the two opposite side, upwardly inclined surfaces 155 may intersect with the central portion at an obtuse angle along each of rearward side edges of the upper transition surface. The upwardly inclined surfaces 155 may extend between each of the rearward side edges of the upper transition surface and substantially an entire length of each of opposite side edges of the rear mounting portion. By configuring the upwardly inclined surfaces 155 to extend along substantially an entire length of each of opposite side edges of the rear mounting portion, the rear mounting portion 52 may be provided with greater support and rigidity relative to the rest of the lip shroud 26, and stresses within the lip shroud may be reduced.

The lower transition surface 154 of the lip shroud 26 may include the opposite side wing portions 157 so as to conform to all of the exposed surfaces of the lip 24 in between each of the teeth 30. Each of the side wing portions 157 may extend substantially vertically upward from each of opposite sides of the lower transition surface 154, and each of the opposite side wing portions 157 may terminate in an upper edge that is substantially horizontal. The upper edge of each of the opposite side wing portions 157 may be configured to merge smoothly into a contiguous one of the outer side edges of the two opposite side, upwardly inclined surfaces 155, again for the purposes of eliminating sharp edges and concave fillets, and reducing stresses within the lip shroud 26. The upper edge of each of the opposite side wing portions 157 and the contiguous one of the outer side edges of the two opposite side, upwardly inclined surfaces 155 may together form an outwardly convex-shaped profile 150 as viewed in a vertical direction. The outwardly convex-shaped profile 150 may merge into each of the opposite side edges of the rear mounting portion 52 at a rear edge 53 of the rear mounting portion 52.

The disclosed lip shroud may be manufactured using conventional techniques such as, for example, casting or molding. Alternatively, the disclosed lip shroud may be manufactured using conventional techniques generally referred to as additive manufacturing or additive fabrication. Known additive manufacturing/fabrication processes include techniques such as, for example, 3D printing. 3D printing is a process wherein material may be deposited in successive layers under the control of a computer. The computer controls additive fabrication equipment to deposit the successive layers according to a three-dimensional model (e.g. a digital file such as an AMF or STL file) that is configured to be converted into a plurality of slices, for example substantially two-dimensional slices, that each define a cross-sectional layer of the lip shroud in order to manufacture, or fabricate, the lip shroud. In one case, the disclosed lip shroud would be an original component and the 3D printing process would be utilized to manufacture the lip shroud. In other cases, the 3D process could be used to replicate an existing lip shroud and the replicated lip shroud could be sold as aftermarket parts. These replicated aftermarket lip shrouds could be either exact copies of the original lip shroud or pseudo copies differing in only non-critical aspects.

Figure 11:
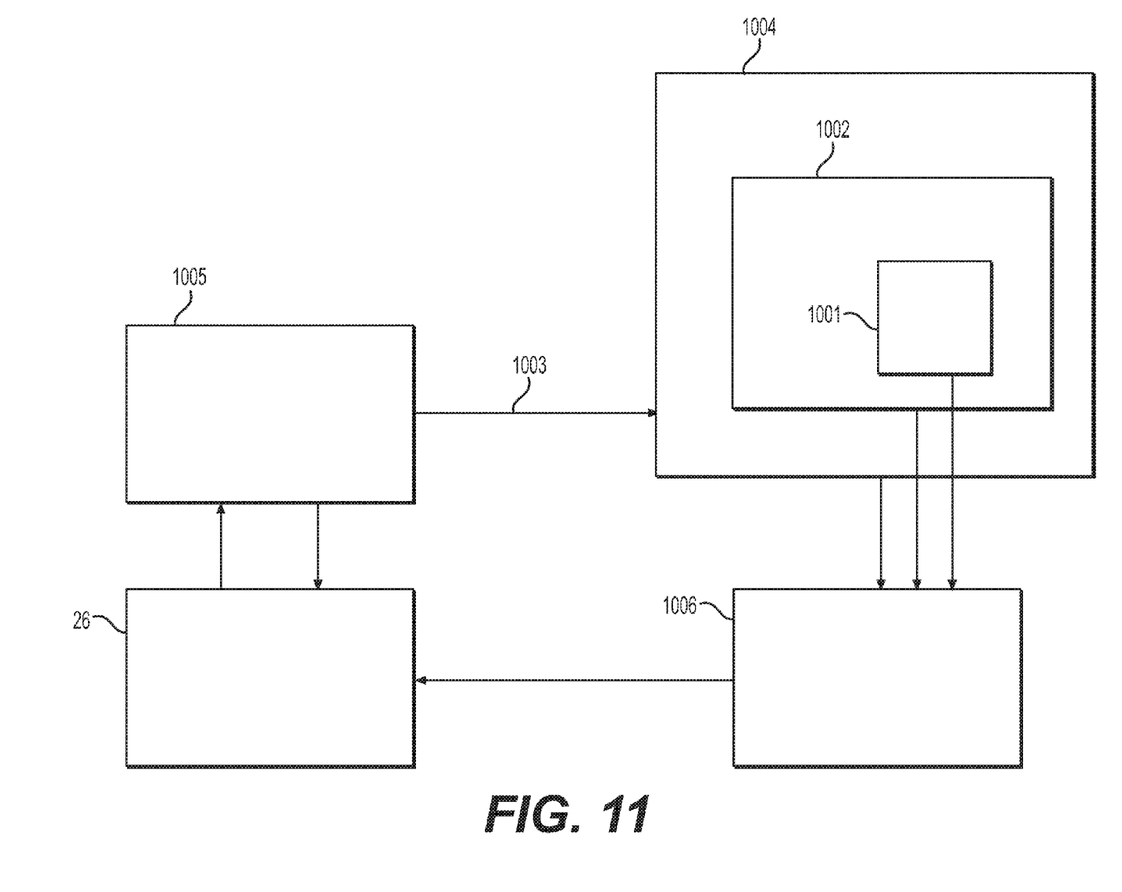
FIG. 11 is a schematic drawing representing a system for generating a three-dimensional model of the lip shroud.

With reference to FIG. 11, the three-dimensional model 1001 used to represent an original lip shroud may be on a computer-readable storage medium 1002 such as, for example, magnetic storage including floppy disk, hard disk, or magnetic tape; semiconductor storage such as solid state disk (SSD) or flash memory; optical disc storage; magneto-optical disc storage; or any other type of physical memory on which information or data readable by at least one processor may be stored. This storage medium may be used in connection with commercially available 3D printers 1006 to manufacture, or fabricate, the lip shroud. Alternatively, the three-dimensional model may be transmitted electronically to the 3D printer 1006 in a streaming fashion without being permanently stored at the location of the 3D printer 1006. In either case, the three-dimensional model constitutes a digital representation of the lip shroud suitable for use in manufacturing the lip shroud.

The three-dimensional model may be formed in a number of known ways. In general, the three-dimensional model is created by inputting data 1003 representing the lip shroud to a computer or a processor 1004 such as a cloud-based software operating system. The data may then be used as a three-dimensional model representing the physical lip shroud. The three-dimensional model is intended to be suitable for the purposes of manufacturing the lip shroud. In an exemplary embodiment, the three-dimensional model is suitable for the purpose of manufacturing the lip shroud by an additive manufacturing technique.

In one embodiment depicted in FIG. 11, the inputting of data may be achieved with a 3D scanner 1005. The method may involve contacting the lip shroud via a contacting and data receiving device and receiving data from the contacting in order to generate the three-dimensional model. For example, 3D scanner 1005 may be a contact-type scanner. The scanned data may be imported into a 3D modeling software program to prepare a digital data set. In one embodiment, the contacting may occur via direct physical contact using a coordinate measuring machine that measures the physical structure of the lip shroud by contacting a probe with the surfaces of the lip shroud in order to generate a three-dimensional model. In other embodiments, the 3D scanner 1005 may be a non-contact type scanner and the method may include directing projected energy (e.g. light or ultrasonic) onto the lip shroud to be replicated and receiving the reflected energy. From this reflected energy, a computer would generate a computer-readable three-dimensional model for use in manufacturing the lip shroud. In various embodiments, multiple 2D images can be used to create a three-dimensional model. For example, 2D slices of a 3D object can be combined to create the three-dimensional model. In lieu of a 3D scanner, the inputting of data may be done using computer-aided design (CAD) software. In this case, the three-dimensional model may be formed by generating a virtual 3D model of the disclosed lip shroud using the CAD software. A three-dimensional model would be generated from the CAD virtual 3D model in order to manufacture the lip shroud.

The additive manufacturing process utilized to create the disclosed lip shroud may involve materials such as plastic, rubber, metal, etc. In some embodiments, additional processes may be performed to create a finished product. Such additional processes may include, for example, one or more of cleaning, hardening, heat treatment, material removal, and polishing. Other processes necessary to complete a finished product may be performed in addition to or in lieu of these identified processes.

It will be apparent to those skilled in the art that various modifications and variations can be made to the disclosed lip shroud and wear assembly. Other embodiments will be apparent to those skilled in the art from consideration of the specification and practice of the disclosed lip shroud and wear assembly. It is intended that the specification and examples be considered as exemplary only, with a true scope being indicated by the following claims and their equivalents.

What is claimed is:

1. A lip shroud comprising:
    a front, wedge-shaped portion;
    an intermediate transition portion; and
    a rear mounting portion opposite the front, wedge-shaped portion, wherein:
        the intermediate transition portion of the lip shroud is configured with at least one upwardly and rearwardly inclined transition surface that merges into a front edge of the rear mounting portion;
        the at least one upwardly and rearwardly inclined transition surface further including two opposite side, upwardly inclined surfaces that extend between rearward side edges of the at least one transition surface and substantially an entire length of each of opposite side edges of the rear mounting portion; and
        the two opposite side, upwardly inclined surfaces including outer side edges configured to form a smooth, upwardly sloped and outwardly convex-shaped profile merging into the opposite side edges of the rear mounting portion.

2. The lip shroud of claim 1, wherein the at least one upwardly and rearwardly inclined transition surface comprises a lower transition surface and an upper transition surface, wherein a first angle formed between the lower transition surface and a horizontal plane is different from a second angle formed between the upper transition surface and the horizontal plane.

3. The lip shroud of claim 1, wherein the front, wedge-shaped portion includes a substantially horizontal lower leg and an upper leg extending from a front edge of the lower leg rearwardly and upwardly to form an acute included angle with the lower leg.

4. The lip shroud of claim 2, wherein the lower transition surface includes a lifting hook protruding therefrom for lifting of the lip shroud.

5. The lip shroud of claim 2, wherein the upper transition surface includes the two opposite side, upwardly inclined surfaces that extend between each of rearward side edges of the upper transition surface and substantially an entire length of each of opposite side edges of the rear mounting portion.

6. The lip shroud of claim 2, wherein the upper transition surface includes a central portion that merges into the front edge of the rear mounting portion, and wherein each of the two opposite side, upwardly inclined surfaces intersects with the central portion at an obtuse angle along each of rearward side edges of the upper transition surface, and extends between each of the rearward side edges of the upper transition surface and substantially an entire length of each of opposite side edges of the rear mounting portion.

7. The lip shroud of claim 2, wherein the lower transition surface includes opposite side wing portions that extend substantially vertically upward from each of opposite sides of the lower transition surface, wherein each of the opposite side wing portions terminates in an upper edge that is substantially horizontal.

8. The lip shroud of claim 7, wherein the upper edge of each of the opposite side wing portions merges smoothly into a contiguous one of the outer side edges of the two opposite side, upwardly inclined surfaces.

9. The lip shroud of claim 8, wherein the upper edge of each of the opposite side wing portions and the contiguous one of the outer side edges of the two opposite side, upwardly inclined surfaces together form an outwardly convex-shaped profile as viewed in a vertical direction, and wherein the outwardly convex-shaped profile merges into each of the opposite side edges of the rear mounting portion at a rear edge of the rear mounting portion.

10. A method of creating a computer-readable three-dimensional model suitable for use in manufacturing the lip shroud of claim 1, the method comprising:
    inputting data representing the lip shroud to a computer; and
    using the data to represent the lip shroud as a three-dimensional model, the three dimensional model being suitable for use in manufacturing the lip shroud.

11. The method of claim 10, wherein the inputting of data includes one or more of using a contact-type 3D scanner to contact the lip shroud, using a non-contact 3D scanner to project energy onto the lip shroud and receive reflected energy, and generating a virtual three-dimensional model of the lip shroud using computer-aided design (CAD) software.

12. A computer-readable three-dimensional model suitable for use in manufacturing the lip shroud of claim 1.

13. A computer-readable storage medium having data stored thereon representing a three-dimensional model suitable for use in manufacturing the lip shroud of claim 1.

14. A method for manufacturing the lip shroud of claim 1, the method comprising the steps of:
    providing a computer-readable three-dimensional model of the lip shroud, the three-dimensional model being configured to be converted into a plurality of slices that each define a cross-sectional layer of the lip shroud; and
    successively forming each layer of the lip shroud by additive manufacturing.

15. A wear assembly for an earth-working tool, the wear assembly comprising:
    a lip;
    at least two teeth connected to a front edge of the lip; and
    at least one lip shroud connected to the front edge of the lip in between the at least two teeth, wherein the lip shroud includes:
        a front, wedge-shaped portion;
        an intermediate transition portion; and a rear mounting portion opposite the front, wedge-shaped portion, wherein:
the intermediate transition portion of the lip shroud is configured with at least one upwardly and rearwardly inclined transition surface that merges into a front edge of the rear mounting portion;
the at least one upwardly and rearwardly inclined transition surface further including two opposite side, upwardly inclined surfaces that extend between rearward side edges of the at least one transition surface and substantially an entire length of each of opposite side edges of the rear mounting portion; and
the two opposite side, upwardly inclined surfaces including outer side edges configured to form a smooth, upwardly sloped and outwardly convex-shaped profile merging into the opposite side edges of the rear mounting portion.

16. The wear assembly of claim 15, wherein the at least one upwardly and rearwardly inclined transition surface of the intermediate transition portion of the lip shroud comprises a lower transition surface and an upper transition surface, wherein a first angle formed between the lower transition surface and a horizontal plane is different from a second angle formed between the upper transition surface and the horizontal plane.

17. The wear assembly of claim 15, wherein the front, wedge-shaped portion of the lip shroud includes a substantially horizontal lower leg and an upper leg extending from a front edge of the lower leg rearwardly and upwardly to form an acute included angle with the lower leg.

18. The wear assembly of claim 16, wherein the lower transition surface of the lip shroud includes a lifting hook protruding therefrom for lifting of the lip shroud.

19. The wear assembly of claim 16, wherein the upper transition surface of the lip shroud includes the two opposite side, upwardly inclined surfaces that extend between each of rearward side edges of the upper transition surface and substantially an entire length of each of opposite side edges of the rear mounting portion.

20. The wear assembly of claim 16, wherein the upper transition surface of the lip shroud includes a central portion that merges into the front edge of the rear mounting portion, and wherein each of the two opposite side, upwardly inclined surfaces intersects with the central portion at an obtuse angle along each of rearward side edges of the upper transition surface, and extends between each of the rearward side edges of the upper transition surface and substantially an entire length of each of opposite side edges of the rear mounting portion.

21. The wear assembly of claim 16, wherein the lower transition surface of the lip shroud includes opposite side wing portions that extend substantially vertically upward from each of opposite sides of the lower transition surface, wherein each of the opposite side wing portions terminates in an upper edge that is substantially horizontal.

22. The wear assembly of claim 21, wherein the upper edge of each of the opposite side wing portions merges smoothly into a contiguous one of the outer side edges of the two opposite side, upwardly inclined surfaces.

23. The wear assembly of claim 22, wherein the upper edge of each of the opposite side wing portions and the contiguous one of the outer sided edges of the two opposite side, upwardly inclined surfaces together form an outwardly convex-shaped profile as viewed in a vertical direction, and wherein the outwardly convex-shaped profile merges into each of the opposite side edges of the rear mounting portion at a rear edge of the rear mounting portion.

24. A lip shroud comprising:
a front, wedge-shaped portion;
an intermediate transition portion; and
a rear mounting portion opposite the front, wedge-shaped portion, wherein:
the intermediate transition portion of the lip shroud is configured with a first upwardly and rearwardly inclined transition surface that forms a first angle with a horizontal plane, and a second upwardly and rearwardly inclined transition surface that forms a second angle different from the first angle with the horizontal plane;
the second upwardly and rearwardly inclined transition surface merging into a front edge of the rear mounting portion;
the second upwardly and rearwardly inclined transition surface further including two opposite side, upwardly inclined surfaces that extend between rearward side edges of the second transition surface and substantially an entire length of each of opposite side edges of the rear mounting portion;
the two opposite side, upwardly inclined surfaces including outer side edges configured to form a smooth, upwardly sloped and outwardly convex-shaped profile merging into the opposite side edges of the rear mounting portion;
the first transition surface including opposite side wing portions that extend substantially vertically upward from each of opposite sides of the first transition surface, wherein each of the opposite side wing portions terminates in an upper edge that is substantially horizontal;
the upper edge of each of the opposite side wing portions merging smoothly into a contiguous one of the outer side edges of the two opposite side, upwardly inclined surfaces; and
the upper edge of each of the opposite side wing portions and the contiguous one of the outer side edges of the two opposite side, upwardly inclined surfaces together form an outwardly convex-shaped profile as viewed in a vertical direction, wherein the outwardly convex-shaped profile merges into each of the opposite side edges of the rear mounting portion at a rear edge of the rear mounting portion.

25. The lip shroud of claim 24, wherein the second transition surface includes a central portion that merges into the front edge of the rear mounting portion, and wherein each of the two opposite side, upwardly inclined surfaces intersects with the central portion at an obtuse angle along each of rearward side edges of the second transition surface, and extends between each of the rearward side edges of the second transition surface and substantially an entire length of each of opposite side edges of the rear mounting portion.

* * * * *